United States Patent
Staub et al.

(10) Patent No.: US 8,933,614 B2
(45) Date of Patent: Jan. 13, 2015

(54) SMALL-SIZED PIEZOELECTRIC TUNING-FORK RESONATOR

(75) Inventors: Felix Staub, Koppigen (CH); Silvio Dalla Piazza, St-Imier (CH)

(73) Assignee: Micro Crystal AG, Grenchen (CH)

( * ) Notice: Subject to any disclaimer, the term of this patent is extended or adjusted under 35 U.S.C. 154(b) by 339 days.

(21) Appl. No.: 13/346,270

(22) Filed: Jan. 9, 2012

(65) Prior Publication Data

US 2013/0175903 A1    Jul. 11, 2013

(51) Int. Cl.
*H03H 9/215*    (2006.01)

(52) U.S. Cl.
CPC ..................................... *H03H 9/215* (2013.01)
USPC ......................................................... 310/370

(58) Field of Classification Search
CPC ............................... H03H 9/21; H03H 9/215
USPC .............................. 310/370; 333/200; 331/156
See application file for complete search history.

(56) References Cited

U.S. PATENT DOCUMENTS

| | | | | |
|---|---|---|---|---|
| 5,367,217 | A * | 11/1994 | Norling | 310/370 |
| 5,717,140 | A * | 2/1998 | Hulsing, II | 73/504.16 |
| 6,700,313 | B2 * | 3/2004 | Dalla Piazza et al. | 310/370 |
| 7,084,556 | B1 * | 8/2006 | Dalla Piazza et al. | 310/370 |
| 7,138,752 | B1 | 11/2006 | Dalla Piazza et al. | |
| 7,401,517 | B2 * | 7/2008 | Pan et al. | 73/504.16 |
| 7,626,318 | B2 | 12/2009 | Dalla Piazza et al. | |
| 7,939,995 | B2 * | 5/2011 | Dalla Piazza | 310/370 |
| 8,053,957 | B2 * | 11/2011 | Sugiyama | 310/370 |
| 8,217,556 | B2 * | 7/2012 | Yamada | 310/370 |
| 8,558,435 | B2 * | 10/2013 | Murata et al. | 310/370 |
| 2003/0067248 | A1 | 4/2003 | Dalla Piazza et al. | |
| 2006/0279176 | A1 * | 12/2006 | Dalla Piazza et al. | 310/348 |
| 2007/0013464 | A1 * | 1/2007 | Pan et al. | 333/200 |
| 2009/0212668 | A1 | 8/2009 | Sugiyama | |
| 2012/0132002 | A1 * | 5/2012 | Dube et al. | 73/504.16 |
| 2013/0241364 | A1 * | 9/2013 | Yamada | 310/370 |
| 2013/0264908 | A1 * | 10/2013 | Matsuo | 310/312 |
| 2013/0283910 | A1 * | 10/2013 | Nishizawa et al. | 73/504.12 |
| 2013/0305824 | A1 * | 11/2013 | Nishizawa et al. | 73/504.12 |

FOREIGN PATENT DOCUMENTS

| | | | |
|---|---|---|---|
| CH | 703271 A2 * | 12/2011 | |
| EP | 2071721 A1 * | 6/2009 | ............... H03H 9/21 |
| JP | 6 112761 | 4/1994 | |
| JP | 2006345519 A * | 12/2006 | |
| JP | 2008 199283 | 8/2008 | |
| JP | 2009 206759 | 9/2009 | |

OTHER PUBLICATIONS

European Search Report issued Jun. 21, 2012, in European Patent Application No. 12 15 0490.

* cited by examiner

*Primary Examiner* — J. San Martin
(74) *Attorney, Agent, or Firm* — Oblon, Spivak, McClelland, Maier & Neustadt, L.L.P.

(57) ABSTRACT

The piezoelectric resonator (21) includes a first and a second planar tuning fork shaped part arranged in a common plane. It is intended to be mounted on a support via a linking part (29), the linking part being arranged to connect the tips of the inner vibrating arms (25a, 25b) of the first and second tuning fork shaped parts so as to link the first and second tuning fork shaped parts together, The electrodes carried by the first and second tuning fork shaped parts are interconnected through the linking part so as to make the outer vibrating arms of the first and second tuning fork shaped part oscillate with opposite phase.

12 Claims, 3 Drawing Sheets

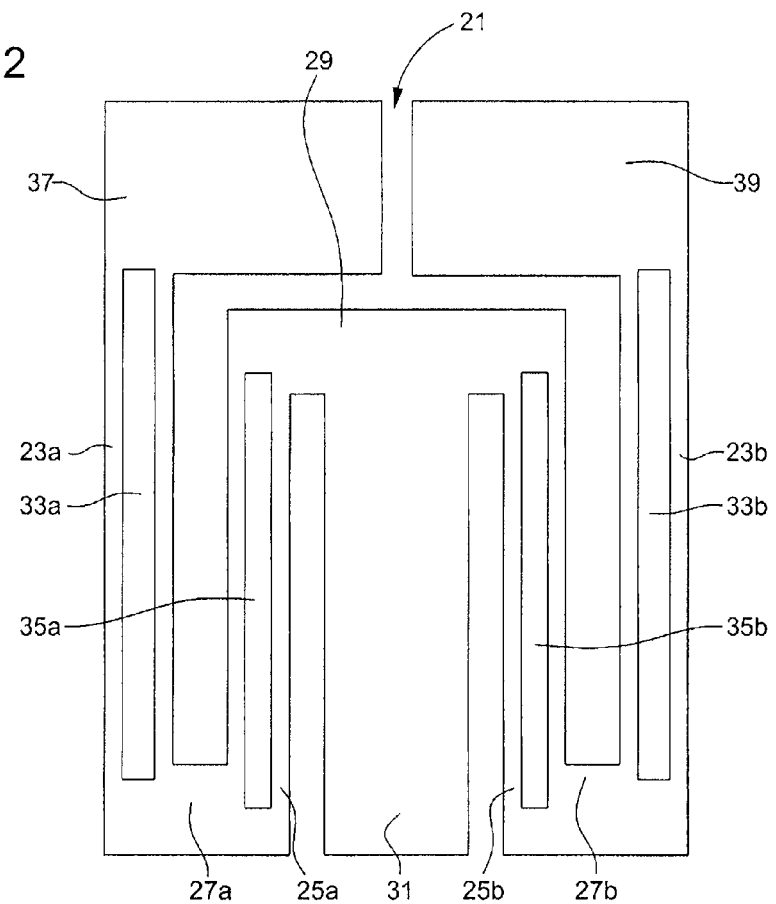
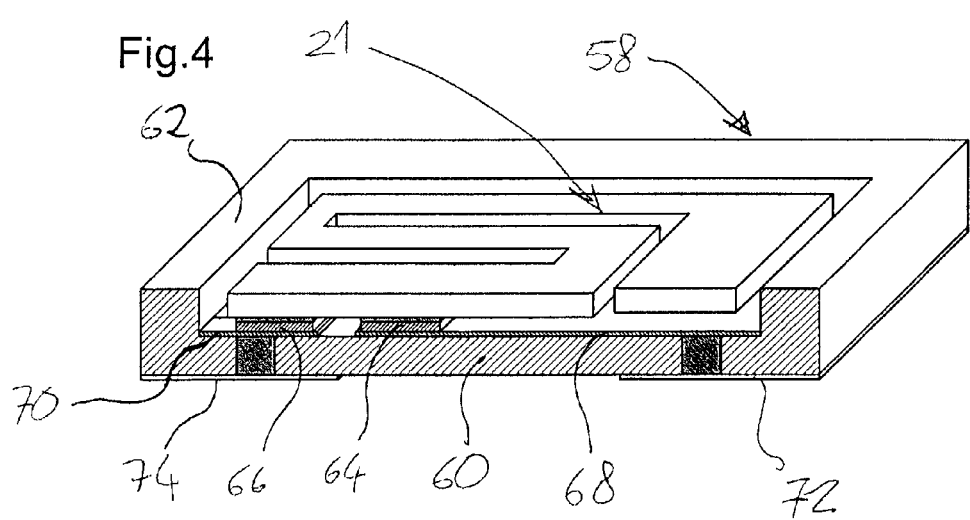

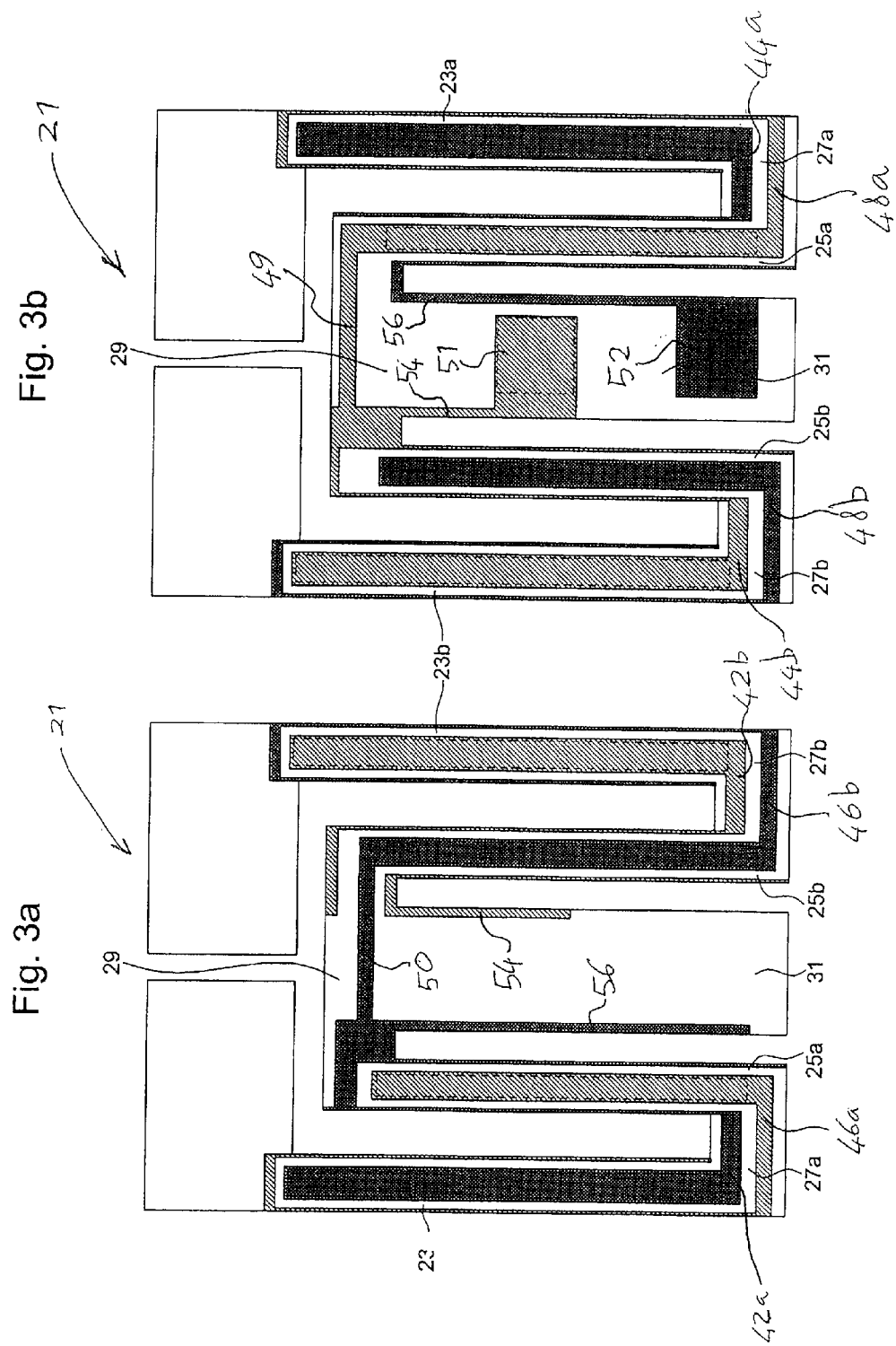

SMALL-SIZED PIEZOELECTRIC TUNING-FORK RESONATOR

FIELD OF THE INVENTION

The present invention concerns piezoelectric tuning-fork resonators and more particularly tuning-fork resonators of small dimensions which are most often used for making frequency generators for portable electronic equipment, in numerous fields such as horology, information technology, telecommunications and the medical field.

BACKGROUND OF THE INVENTION

A piezoelectric resonator of this type with small dimensions has already been disclosed in the prior art document U.S. Pat. No. 7,626,318, which is incorporated herein by reference. The appended FIG. 1 is a reproduction of the FIG. 1 of this prior art document. Referring to this figure, one can see that the depicted tuning-fork resonator 1 is formed of a base 4 and two vibrating arms 2, 3 extending from the base. In a known manner, each arm carries metalized portions 5, 6 that form central electrodes on the main opposite surfaces and lateral electrodes along the sides of each arm. The central electrodes on one arm are connected to the lateral electrodes on the other arm and to one terminal of an oscillator circuit. The other central and lateral electrodes are connected in an identical manner to the other terminal of the oscillator circuit. The oscillator circuit is an electrical circuit arranged to subject the electrodes to an oscillating electric current that causes the arms to vibrate at a desired fundamental frequency.

Grooves 7, 8 are provided in each arm. The arrangement of the central electrodes inside the grooves, in the thickness of the arms, increases piezoelectric coupling. For a resonator having the same dimensions, the increase of the coupling causes a decrease in the equivalent resistance for a given resonator quality factor and consequently a decrease in the power consumption thereof. Conversely, for the same equivalent resistance, the presence of the grooves allows a reduction in the dimensions of the resonator. In substance, the use of grooves makes it possible to produce highly miniaturized resonators with the same given resonant frequency.

There is however a limit to miniaturization. Indeed, theory shows that, if the length of the vibrating arms is L and the width of the arms is W, the fundamental resonant frequency tends to behave like $W/L^2$. It follows that, for a given resonant frequency, the shorter the length of an arm is, the narrower its width must be. A consequence is that, below a certain dimension, the vibrating arms must be made so narrow that the reduction in the volume of the elastically active piezoelectric material is associated with an unacceptable decrease in the quality factor. Notwithstanding, in order to attain a higher degree of miniaturization, the above-mentioned prior art document further teaches that the vibrating arms each end in an enlarged portion called a flipper 9, 10. The flippers have the effect of lowering the frequency for a given length, and thus allow having shorter vibrating arms for the same given frequency.

It is an object of the present invention to provide a piezoelectric resonator compatible with a higher degree of miniaturization than prior art resonators, without overly reducing the quality factor or increasing the equivalent resistance.

SUMMARY OF THE INVENTION

The present invention achieves the object cited above by providing a piezoelectric tuning-fork resonator in accordance with the annexed claim 1.

According to the invention, the piezoelectric resonator is intended to be mounted on a support via the linking part. This arrangement implies that the tuning-fork shaped parts are both held by the tip of one of their vibrating arms. This is in contrast with the standard case, according to which a single tuning-fork is normally held via the cross portion, in the middle. Furthermore, as the two vibrating arms of each tuning-fork shaped part vibrate with opposite phase, when the two vibrating arms of the same tuning fork shaped part are bending, the individual contributions of the two arms to the total displacement add up. In practice, this means that during one oscillation, the tip of the vibrating arm that is not held travels roughly twice as far as it would if the tuning fork had been held in the usual manner; by the cross portion. In other words, when it is held by the tip of one arm, each tuning fork shaped part behaves in a similar fashion to a single vibrating arm roughly twice as long. This feature contrasts with the well known case of a tuning-fork held in the middle, in which the individual contributions of the two arms compensate each other.

Therefore, an advantage of the present invention is that the arms of the tuning fork shaped parts can be made roughly twice as short for the same resonant frequency. This can translate into a substantial reduction in the length of a resonator.

BRIEF DESCRIPTION OF THE DRAWINGS

Other features and advantages of the present invention will appear upon reading the following description, given solely by way of non-limiting example, and made with reference to the annexed drawings, in which:

FIG. 2 is a planar view of a piezoelectric tuning-fork resonator according to a particular embodiment of the invention;

FIGS. 3a and 3b are top and bottom views respectively of the piezoelectric tuning-fork resonator of FIG. 2, showing the metalized portions which form two groups of electrodes;

FIG. 4 is a perspective view of a median longitudinal cross-section of the resonator of FIG. 2, the resonator being mounted in a case.

DETAILED DESCRIPTION OF THE INVENTION

Figure 1:
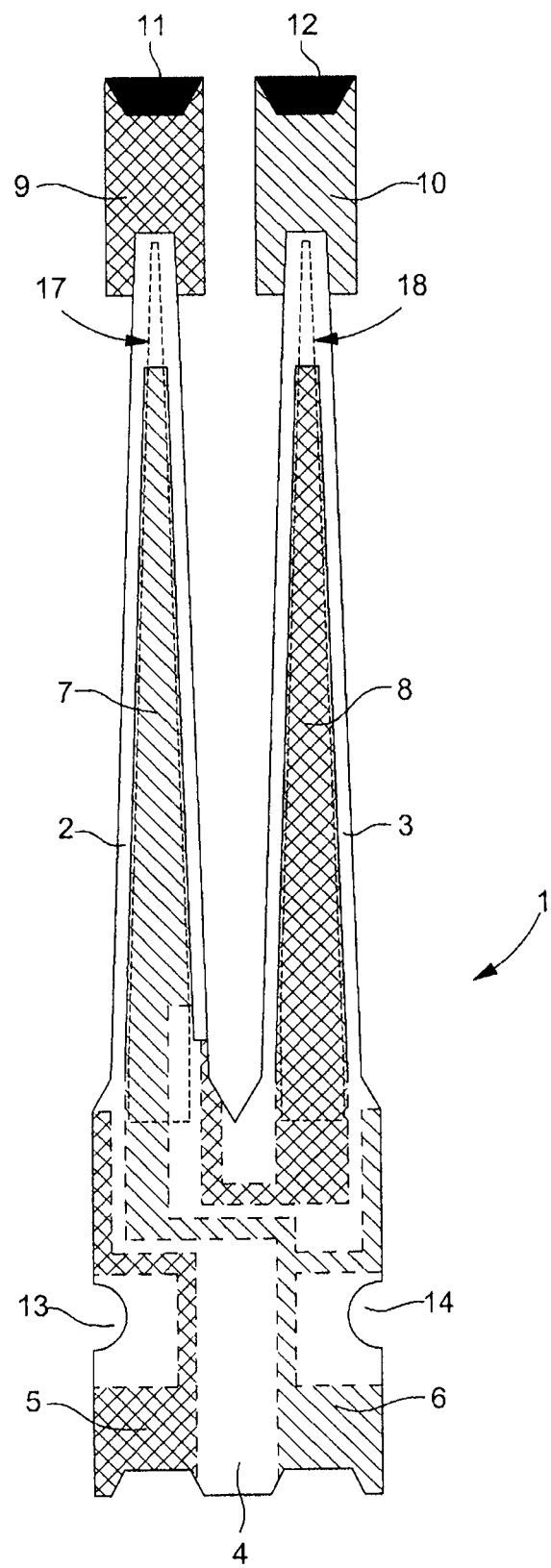
FIG. 1 shows a prior art piezoelectric tuning-fork resonator.

An exemplary embodiment of the invention will be described bellow with reference to FIGS. 2, 3a, 3b and 4. In this particular embodiment, the piezoelectric tuning-fork resonator, designated by the general reference 21, includes a first and a second planar tuning-fork shaped part. Each tuning-fork shaped part comprises two vibrating arms extending substantially in the same direction from a cross portion. Referring to FIG. 2 in particular, one can observe that the vibrating arms of one tuning-fork shaped part are referenced 23a and 25a, the vibrating arms of the other tuning-fork shaped part are referenced 23b and 25b, and the cross portions of the two tuning-fork shaped parts are referenced 27a and 27b respectively. As further shown in FIG. 2, the two tuning-fork shaped parts are arranged side by side in the same plane. In the present example, the tuning-fork shaped parts are arranged symmetrically and parallel to each other. However, one should understand that this is not necessarily the case according to the invention. Furthermore, the resonator of the present example is made out of a single piece of piezoelectric material, preferably quartz. It should be understood however that, according to other embodiments, the assembly could alternatively be made out of a non-piezoelectric material, silicon for example, and be coated with a piezoelectric thin film.

According to the invention, the first and the second tuning-fork shaped parts are linked together by linking part 29. Referring again to FIG. 2, one can see that, in the depicted example, the tuning-fork shaped parts are arranged on either side of the axis of symmetry of the drawing and that the linking part, which is located in the center, spans the axis of symmetry. The linking part extends between the tip of a vibrating arm 25*a* on one side of the axis of symmetry and the tip of a vibrating arm 25*b* on the other side. The vibrating arms 25*a* and 25*b* will be called hereafter the inner vibrating arms, and the other vibrating arms (referenced 23*a* and 23*b*) will be called the outer vibrating arms. In the present example, the resonator 21 further comprises a central arm 31 located between the inner vibrating arms. The central arm extends from the linking part 29, in the plane of the vibrating arms, substantially equidistant from the inner vibrating arms. According to the depicted embodiment, the length of the central arm is chosen so that the distal end of the central arm is on a line with the two cross portions 27*a* and 27*b*. It should be understood however that alternative embodiments of the resonator could have a longer, or preferably a shorter, central arm. One will also observe that the central arm shown in the figures is wider than the vibrating arms. Indeed, the width of the central arm is preferably at least twice the width of a vibrating arm.

Grooves 33*a*, 33*b*, 35*a*, 35*b* are formed in at least one of the upper and lower main surfaces of each vibrating arm. FIG. 2 shows that the grooves each start inside one of the cross portions 27*a* and 27*b* and extend along the full length of an arm. As shown in FIGS. 3*a* and 3*b*, the tuning-fork shaped parts and the linking part 29 further carry metalized portions, i.e. conductive depositions, which form two groups of electrodes similar to those of the resonator of FIG. 1. These two groups of electrodes enable the piezoelectric material of the arms 23*a*, 23*b*, 25*a*, 25*b* to be subjected to electric fields in order to make the arms vibrate at a desired frequency called the fundamental frequency. Both groups of electrodes comprise central electrodes formed inside the grooves of the top and bottom main surfaces of the arms, as well as lateral electrodes along the sides of the arms. Still referring to FIGS. 3*a* and 3*b*, one will understand that the metalized depositions formed on cross portions 27*a*, 27*b* and on the linking part 29 serve to connect the central electrodes located on one arm to the lateral electrodes located on another arm, and vice versa. More specifically, the conductive paths 42*a*, 44*a* formed on the cross portion 27*a* of a particular tuning-fork shaped part (referred to as tuning-fork shaped part "a") connect the central electrodes disposed on the outer vibrating arm 23*a* of the tuning-fork shaped part to the lateral electrodes disposed on the inner vibrating arm 25*a* of the tuning-fork shaped part. Conversely, the conductive paths 46*a*, 48*a* on the cross portion 27*a* connect the lateral electrodes disposed on the outer vibrating arm 23*a* to the central electrodes disposed on the inner vibrating arm 25*a*. In an identical manner, conductive paths 42*b*, 44*b*, 46*b*, 48*b* on formed on the cross portion 27*b* of the other tuning-fork shaped part connect central and lateral electrodes disposed on the vibrating arms of tuning-fork shaped part "b".

Still referring to FIGS. 3*a* and 3*b*, one will note that the linking part 29 carries conductive paths 50 and 49 visible on its top and bottom sides respectively. One will understand that one of these two conductive paths serves to connect the central electrodes on the inner vibrating arm of one tuning fork shaped part to the lateral electrodes on the inner vibrating arm of the other tuning fork shaped part. And that, in an identical manner, the other conductive path serves to connect the other central and lateral electrodes located on the inner vibrating arms. FIG. 3*b* further shows that the central arm carries two conductive connection pads 51, 52 on its bottom side. The connection pads 51, 52 are each connected to a group of electrodes by a conductive path (referenced 54 and 56 respectively). More specifically, conductive path 54 connects connection pad 51 to conductive path 49, and conductive path 56 connects connection pad 52 to conductive path 50.

The electrodes and conductive paths just described are arranged to make the arms 23*a*, 23*b*, 25*a*, 25*b* vibrate in flexural mode. However, they could alternatively have been arranged in a different configuration adapted to make the arms vibrate in the same mode or in another mode (torsion, shearing, etc).

FIG. 4 is a perspective view of a median longitudinal cross-section of the resonator of FIG. 2. FIG. 4 shows how the resonator can be mounted in a case. The case (referenced 58) has a rectangular shape, only half of which is shown. It includes a main part formed by a flat bottom 60 and four sides 62, and a cover (not shown). The cover is designed to be vacuum soldered onto the main part after the resonator 21 has been mounted inside the case (58). The mounting of the resonator inside the case is achieved by soldering or gluing its connection pads 51, 52 onto respective conductive studs 64, 66 formed on the bottom 60 of the case. Still referring to FIG. 4, one can observe that the studs 64, 66 are electrically connected to external contact pads 72, 74 of the case by means of inner paths 68, 70 formed on the flat bottom 60. One will understand from the above description that, according to the present example, the flat bottom of the case serves as a support onto which the resonator is mounted.

According to the described example, studs 64, 66 are gold bumps. However, it should be understood that the studs could be made differently. For example, these studs could be formed by small ceramic parts glued onto the flat bottom 60. In this case, connection pads 51, 52 of the resonator could then be glued onto these ceramic parts with a conductive adhesive, which would at least partly encapsulates the ceramic parts in order to assure electric connection between the pads 51, 52 located on top of the ceramic parts and the inner paths 68, 70 located at the base of the ceramic parts.

It should also be noted that the length of a resonator like resonator 21 is not only considerably shorter than the length of a resonator like the one illustrated in FIG. 1. The ratio between the length and the width of the resonator is also better suited for mounting the resonator in an SMD type case. This ratio can even be calculated such that the resonator can be mounted in a case of square shape, to facilitate manufacture of the said case, and by selecting a suitable arrangement for studs 64, 66 and pads 51, 52, for example an L configuration, and by disposing them properly, for example such that the Ls form a square, it is possible to place the resonator in the case in four different positions. This feature can facilitate the automatic mounting of the resonator.

What is claimed is:

1. A piezoelectric resonator intended to be mounted on a support and including a first and a second planar tuning fork shaped part arranged in a common plane, the first and the second tuning fork shaped parts each having an inner vibrating arm, an outer vibrating arm and a cross portion, the inner and the outer vibrating arms each having an upper main surface and a lower main surface and two side surfaces extending between the upper and the lower main surfaces, and the inner and outer vibrating arms of the same tuning fork shaped part extending from the cross portion, substantially parallel to each other, and carrying electrodes connected to connection pads, wherein the electrodes comprise central electrodes disposed on the upper and lower main surfaces of the vibrating arms, and lateral electrodes disposed on side surfaces of the vibrating arms, wherein the central electrodes disposed on the outer vibrating arm of either of the tuning-fork shaped parts are connected to the lateral electrodes disposed on the inner vibrating arm of the same tuning-fork shaped part, and the lateral electrodes disposed on the outer vibrating arm of either of the tuning-fork shaped parts are connected to the central electrodes disposed on the inner vibrating arm of the same tuning-fork shaped part, so that the electrodes make the inner and the outer vibrating arms of either tuning fork shaped part oscillate with opposite phase, wherein the piezoelectric resonator is configured to be mounted on the support via a linking part, the linking part being arranged to connect the tips of the inner vibrating arms of the first and the second tuning fork shaped parts so as to link the first and second tuning fork shaped parts together, and wherein the electrodes carried by the first and second tuning fork shaped parts are interconnected through the linking part so as to make the outer vibrating arms of the first and second tuning fork shaped part oscillate with opposite phase.

2. The piezoelectric resonator of claim 1, wherein the central electrodes disposed on the outer vibrating arm of the first tuning-fork shaped part are connected to the lateral electrodes disposed on the inner vibrating arm of the same tuning-fork, to the central electrodes disposed in the inner vibrating arm of the second tuning fork shaped part, and to the lateral electrodes disposed on the outer vibrating arm of the second tuning-fork shaped part, and wherein the central electrodes disposed on the outer vibrating arm of the second tuning-fork shaped part are connected to the lateral electrodes disposed on the inner vibrating arm of the same tuning-fork shaped part, to the central electrodes disposed in the inner vibrating arm of the first tuning fork shaped part, and to the lateral electrodes disposed on the outer vibrating arm of the first tuning-fork shaped part.

3. The piezoelectric resonator of claim 1, wherein the first and the second planar tuning fork shaped part are arranged symmetrically and parallel to each other.

4. The piezoelectric resonator of claim 1, wherein it is made out of a single quartz crystal.

5. The piezoelectric resonator of claim 1, wherein at least one groove is formed on at least one of the upper and the lower mains surfaces of each vibrating arm.

6. The piezoelectric resonator of claim 5, wherein the depth of said groove is between 15% and 50% of the thickness of said vibrating arms in the depth direction.

7. The piezoelectric resonator of claim 5, wherein the depth of said groove is between 30% and 50% of the thickness of said vibrating arms in the depth direction.

8. The piezoelectric resonator of claim 1, wherein the outer vibrating arms end in flippers extending beyond the linking part, the width of the flippers being larger than that of the outer vibrating arms.

9. A piezoelectric resonator to be mounted on a support and including a first and a second planar tuning fork shaped part arranged in a common plane, the first and the second tuning fork shaped parts each having an inner vibrating arm, an outer vibrating arm and a cross portion, the inner and the outer vibrating arms of the same tuning fork shaped part extending from the cross portion, substantially parallel to each other, and carrying electrodes arranged to make the inner and the outer vibrating arms oscillate with opposite phase the electrodes being connected to connection pads, wherein the piezoelectric resonator is configured to be mounted on the support via a linking part, the linking part being arranged to connect the tips of the inner vibrating arms of the first and the second tuning fork shaped parts so as to link the first and second tuning fork shaped parts together, and wherein the electrodes carried by the first and second tuning fork shaped parts are interconnected through the linking part so as to make the outer vibrating arms of the first and second tuning fork shaped part oscillate with opposite phase, wherein a central arm is attached to the linking part and is located between the inner vibrating arms, sunstantially equidistant from these arms.

10. The piezoelectric resonator of claim 7, wherein the connection pads are carried by the central arm.

11. The piezoelectric resonator of claim 10, wherein the central arm is at least twice as wide as a vibrating arm.

12. The piezoelectric resonator of claim 11, wherein its mounting onto the support is achieved by soldering or gluing the two connection pads onto respective conductive studs formed on a top surface of the support.

* * * * *